United States Patent [19]

Manzur et al.

[11] Patent Number: 5,274,588
[45] Date of Patent: Dec. 28, 1993

[54] SPLIT-GATE CELL FOR AN EEPROM

[75] Inventors: Gill Manzur, Arcola; Rana Lahiry, Houston; Cetin Kaya, Dallas, all of Tex.

[73] Assignee: Texas Instruments Incorporated, Dallas, Tex.

[21] Appl. No.: 735,978

[22] Filed: Jul. 25, 1991

[51] Int. Cl.$^5$ .................... H01L 29/68; H01L 29/34
[52] U.S. Cl. .................... 365/185; 257/314; 257/316; 257/321; 365/182; 365/103
[58] Field of Search .................... 357/45, 23.5, 23.1; 365/185, 182, 103; 257/314, 316, 321

[56] References Cited

U.S. PATENT DOCUMENTS

| | | | |
|---|---|---|---|
| 4,616,340 | 10/1986 | Hayashi et al. | 357/23.5 |
| 4,622,656 | 11/1986 | Kamiya et al. | 357/23.5 |
| 4,839,705 | 6/1989 | Tigelaar et al. | 357/23.5 |
| 4,949,140 | 8/1990 | Tam | 357/23.5 |
| 4,985,717 | 1/1991 | Aronowitz et al. | 357/23.5 |
| 4,998,220 | 3/1991 | Eitan et al. | 357/23.5 |
| 5,016,215 | 5/1991 | Tigelaar | 357/23.5 |
| 5,017,980 | 5/1991 | Gill et al. | 357/23.5 |
| 5,057,886 | 10/1991 | Riemenschneider | 365/185 |
| 5,115,288 | 5/1992 | Manley | 365/185 |

Primary Examiner—Eugene R. LaRoche
Assistant Examiner—Viet Q. Nguyen
Attorney, Agent, or Firm—Peter T. Rutkowski; Richard L. Donaldson; William E. Hiller

[57] ABSTRACT

A non-volatile memory cell includes heavily doped source 12 and drain 14 regions separated by a channel region 16. The source 12 and drain 14 are isolated from floating gate 18 and control gate 22 by thick oxide 36. A floating gate 18 is formed over and insulated from a portion of said channel region 16 adjacent to the source 12 and a control gate 22 is formed over and insulated from the floating gate 18 and the remaining portion of the channel region 16. The cell is programmed by applying a nearly reference voltage $V_s$ to the source region 12 and applying a drain voltage $V_D$ to the drain region 14. A gate voltage $V_G$ is applied to the control gate 22 such that an inversion region 15 is formed in the remaining portion of said channel region 16 such that the floating gate 18 is charged up by hot electron injection on the side away from the source junction. The source junction is self aligned to floating gate and is graded for efficient erase. Other key features and methods are also disclosed.

14 Claims, 3 Drawing Sheets

SPLIT-GATE CELL FOR AN EEPROM

CROSS REFERENCE TO RELATED APPLICATIONS

The following co-assigned patent applications are hereby incorporated herein by reference: Ser. No. 07/641,952, Filing Date Jan. 17, 1991; TI Case No. TI-15262.

FIELD OF THE INVENTION

This invention generally relates to semiconductor devices and specifically to a non-volatile memory cell and method for forming and using the same.

BACKGROUND OF THE INVENTION

A read-only memory (ROM) is a type of memory in which data can be permanently stored, for example, by blowing metallic links during programming thereof. Such type of memory can be conventionally accessed at specific locations to read the programmed contents thereof. A much more versatile type of ROM is the programmable read-only memory (PROM) which can be electrically programmed to store data. Some versions of these devices store data permanently; others, however, can be erased with ultraviolet light or an electrical current.

The construction of a floating gate EEPROM (electrically erasable programmable read only memory) cell is similar to that of a field effect transistor, but additionally includes a floating gate between the control gate conductor and the conduction channel of the transistor. In the case of flash EEPROMs employing hot electron injection for programming, channel hot electrons and avalanche injection electrons are injected into and trapped in the floating gate. This condition increases the threshold voltage of the cell, thereby rendering it cutoff in response to normal read operation voltages. Hence, during reading of a cell so programmed, the cell will remain nonconductive (e.g., "0" state) and thus represent a high impedance between the source and drain. On the other hand, cells which have not been programmed will remain conductive (e.g., "1" state) in response to normal read operating voltages. In this manner, the memory can be programmed.

An abrupt junction is desired in order to have a device with enhanced programmability. On the other hand, a graded junction is necessary for enhanced erasability. To meet these criteria, the cell may be programmed at one junction (e.g., drain/channel junction) and may be erased at the other junction (e.g., source/channel junction).

A split-gate cell for an EEPROM has been previously described by G. Samachisa et al. in "A 128K Flash EEPROM Using Double Polysilicon Technology" (ISSCC 1987, p. 76). In this cell, the floating gate overlies only a portion of the channel and the control gate overlies both the floating gate and the remainder of the channel. In other words, there are two transistors in series between a source and a drain.

An EEPROM cell needs optimized programming as well as erasability. To program the device an abrupt junction is needed so that channel hot electron injection can be optimized. On the other hand, the erase function requires a graded junction with a certain amount of n+region underlapping the floating gate. In prior split-gate structures, however, there is only one junction which is used both for programming as well as for erasing. Since programming requires abrupt junction and erase requires a graded junction, there are two conflicting requirements which must be imposed on prior art split gate structures to make this device work. These conflicting requirements make a very poor tradeoff both for the programming as well as the erase characteristics of the cell since the junction is fabricated so that it is neither graded nor abrupt but rather somewhere in between.

Accordingly, improvements which overcome any or all of the problems are presently desirable.

SUMMARY OF THE INVENTION

Other objects and advantages will be obvious, and will in part appear hereinafter and will be accomplished by the present invention which describes a non-volatile memory cell and a method for making and using the same.

A non-volatile memory cell includes heavily doped source and drain regions separated by a channel region. A floating gate is formed over and insulated from a portion of said channel region adjacent to said source and a control gate is formed over and insulated from the floating gate and the remaining portion of the channel region. The channel length of the floating gate structure is defined by the floating gate layer and the source which a implanted self-aligned to the floating gate. The source junction is graded to optimize the erase function of the cell. The drain junction may also be graded without adversely effecting the programmability of the cell. The source and drain regions are buried under and insulated from the control gate by a thick insulator. The buried source/drain regions allow the cell to be integrated into a contactless array.

The cell is programmed by applying a source voltage to the source region and a gate voltage is applied to the control gate. A drain voltage is applied to the drain region such that an inversion region, that is an extended drain, is formed between the drain and the floating gate such that electrons are injected into the floating gate from the middle of the cell, near that end of the floating gate which is away from the source.

An advantage of the invention is that in this split-gate cell, the erase and program functions are performed at different regions which may be independently optimized for the specific functions. The prior art, on the other hand, uses one junction for both programming and erasing functions. In the prior art, the junction cannot be tailored for either function since it is used for both.

Another advantage is the increased lifetime and write/erase endurance of the cell since the junctions have been optimized for specific tasks. Still further, since the cell may be read on a graded junction, the read disturb is also minimized. The pass gate channel oxide and drain junctions can be optimized to avoid read disturb without effecting the program or erase characteristics. In other words, channel hot electron injection into the pass gate can be minimized during the read operation. This is an attractive quality in a memory cell.

Still another advantage of the invention is that the drain disturb during programming is avoided since the drain junction is away from the floating gate structure. The pass gate channel oxide can be made thicker than the FAMOS (floating gate avalanche metal oxide semiconductor) gate oxide, and the drain junction can be graded leading to improved drain junction field plate breakdown voltage. These features lead to minimized drain dependent turn on of FAMOS.

BRIEF DESCRIPTION OF THE DRAWINGS

The above features of the present invention will be more clearly understood from consideration of the following descriptions in connection with accompanying drawings in which:

FIGS. 5a–5e are cross sectional views of the embodiment of FIG. 1 illustrating various steps in the multilayer process of the invention.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the apparatus and method of the fabrication and use of the present invention. The preferred embodiment will be described first followed by a description of modifications. The method of using the invention will then be described. An exemplary method of fabrication will then be discussed.

Figure 1:
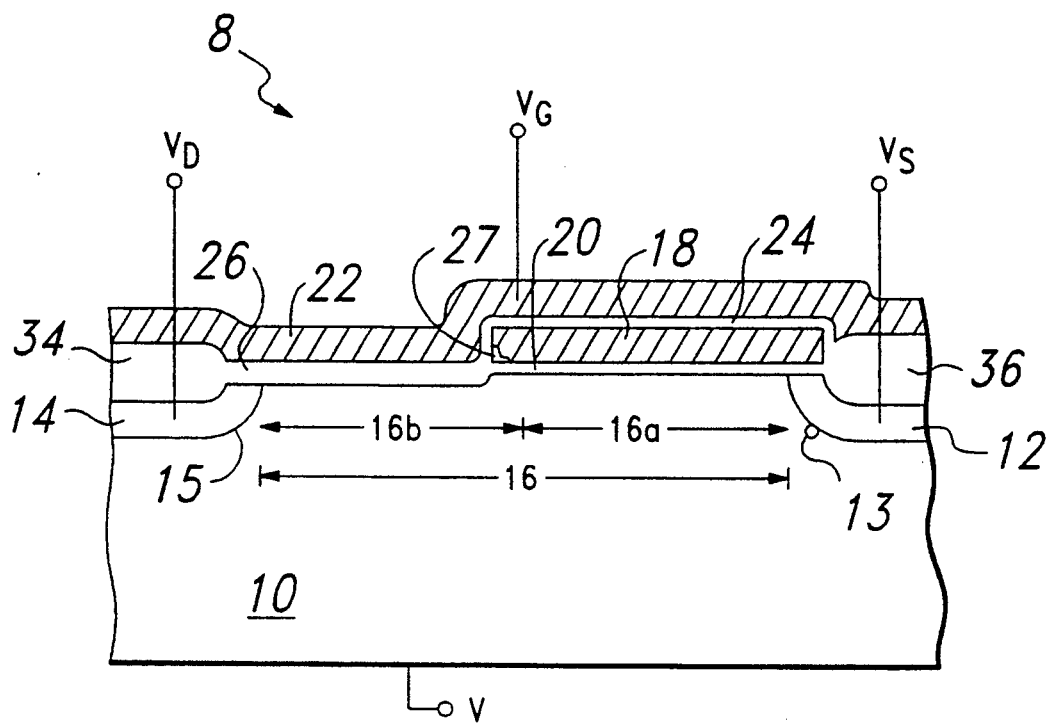
FIG. 1 is a cross sectional view of a preferred embodiment along the A—A' line of FIG. 3a or FIG. 3b.

A cross sectional view of the cell, parallel to and through the control gate, is shown in FIG. 1. A split-gate memory cell 8 comprises a semiconductor substrate 10 which has doped source and drain regions 12 and 14, respectively, formed on the surface of the substrate 10. In one common embodiment, the substrate 10 comprises p-type silicon and the source and drain regions 12 and 14 are n+ doped silicon.

The source 12 and drain 14 are separated by a channel region 16. Typical source/drain doping concentrations are well known in the current art. The source/channel junction 13 is a graded junction to optimize cell erasure. The drain/channel junction 15 may be either an abrupt junction or a graded junction.

A conductive floating gate 18 is formed over a first portion of the channel region 16a adjacent to the source 12. This floating gate 18 may typically be comprised of polysilicon, for example, and therefore is sometimes referred to as Poly 1. An insulating layer 20, typically an oxide such as silicon dioxide, separates the floating gate 18 from the channel region 16a. The insulating layer 20 is often called the FAMOS (Floating gate Avalanche Metal Oxide Semiconductor) gate oxide and is typically 80 Å to 120 Å thick for flash EPROMs and can be 80 Å to 300 Å thick for UV erasable EPROMs.

A conductive control gate (or pass gate) 22, typically comprised of polysilicon and therefore sometimes referred to as Poly 2, is formed over the floating gate 18 and over the remaining portion of the channel region 16b. The remaining portion of the channel region 16b is the portion of the channel region 16b which is beneath control gate 22 but not beneath floating gate 18. The control gate 22 is separated from the floating gate 18 by an insulation layer 24 and the control gate 22 is separated from the remaining portion of the channel region by an insulation layer 26. The insulation layer 26 is often called the pass transistor gate oxide and can be about 100 Å to 500 Å thick, for example. The thickness of the pass gate oxide 26 below the control gate 22 may be greater than the thickness of the FAMOS oxide 20 beneath the floating gate 18.

The source region 12 is self-aligned to the floating gate 18 upon fabrication. Subsequent diffusion of impurities will cause the source 12 to be spaced below floating gate 18. The source 12 and the drain 14 are buried under and insulated from the control gate by a thick insulator 36 and 34, respectively. The thick insulator 34 (36) may typically comprise an oxide such as silicon dioxide and for example may be about 1500 Å to 5000 Å thick. The self-alignment of the source 12 with the floating gate 18 is an advantage since the channel length of the floating gate structure is defined by this step.

To optimize the write characteristics of the memory cell 8, it may be desirable to dope the channel region 16, preferably with the doping concentration in region beneath the pass gate oxide 26 greater than the concentration in region beneath the FAMOS oxide 10 as described in co-pending application Ser No. 641,952 (TI-15262), incorporated herein by reference. An example average doping concentration of the channel region 16b beneath the pass gate oxide 26 is between about $1 \times 10^{17}$ cm$^{-3}$ and $4 \times 10^{17}$ cm$^{-3}$ while the channel region 16a beneath the FAMOS oxide 20 is between about $6 \times 10^{16}$ cm$^{-3}$ and $2 \times 10^{17}$ cm$^{-3}$.

An example of a memory cell as described above would have a boron doped silicon channel 16 with n+ doped source and drain regions 12 and 14, respectively. Doping concentrations for these regions are well known in the art. In a preferred embodiment, a 2000 Å polysilicon floating gate 18 is formed over a 100 Å FAMOS oxide layer 20. A 3000 Å control gate 22 is formed over 200–400 Å pass gate oxide 26 and is electrically insulated from the floating gate 18 by a dielectric layer 24. The dielectric layer 24 is comprised of about 125 Å oxide and about 150 Å silicon nitride and 20 Å to 50 Å of oxided nitride. The composite ONO layer 24 has an oxide equivalent thickness of about 200 Å to 300 Å. In this example, all the oxide layers are comprised of silicon dioxide.

Figure 2:
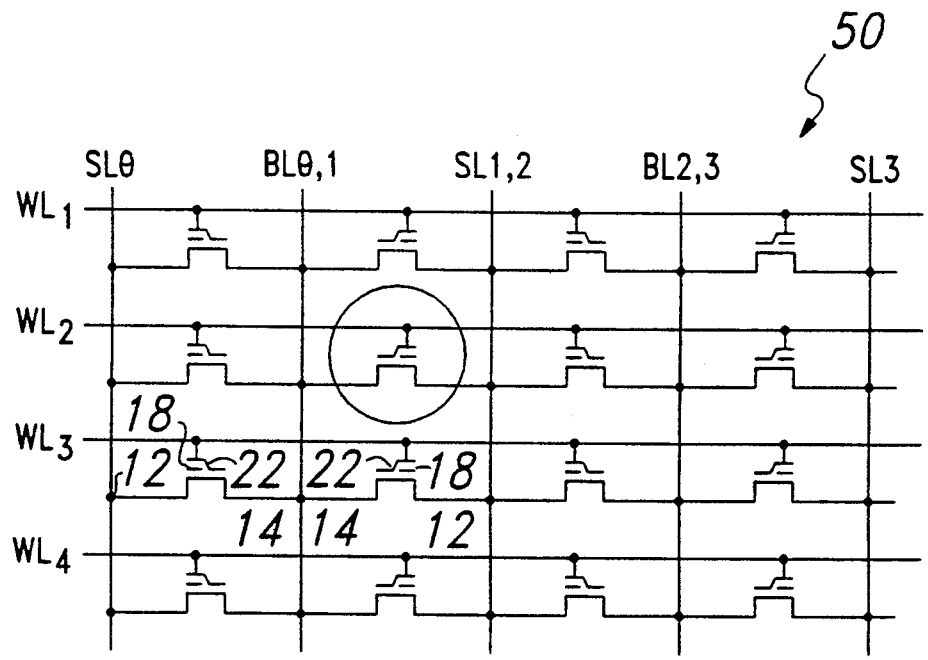
FIG. 2 is a schematic representation of a portion of a multi-cell array embodiment in a virtual ground configuration.

The cell of this invention can be integrated into a virtual ground or a dedicated ground array architecture. It should be noted that the memory cell 8 described above could be one of many such cells in a larger memory array. A portion of one such array, generally noted at 50, is shown schematically in FIG. 2 (the logic and control circuitry not shown) which shows 16 cells in a virtual ground array configuration. In this configuration, adjacent cells share doped regions. In other words, the drain region 14 of one cell is also the drain region 14 of an adjacent cell, and likewise the source region 12 of one cell is also the source region 12 of an adjacent cell. These regions are referred to as source lines and bit lines and are shown in FIG. 2 as SLO; BLO,1; SL1,2; BL1,3 and SL3. Also, an entire row of devices share a common control gate referred to as a word line. The word lines in FIG. 2 are WL1, WL2, WL3, and WL4.

The programming operation of a virtual ground array for a 1-T cell is a known art. In the virtual ground array shown in FIG. 2, a drain junction is shared by two adjacent cells and similarly a source junction is shared by two adjacent cells. During programming, the deselected programmed cells common to the selected column do not experience the drain disturb (bit line stress) because of the presence of pass gate adjacent the drain junction.

Figure 3A:
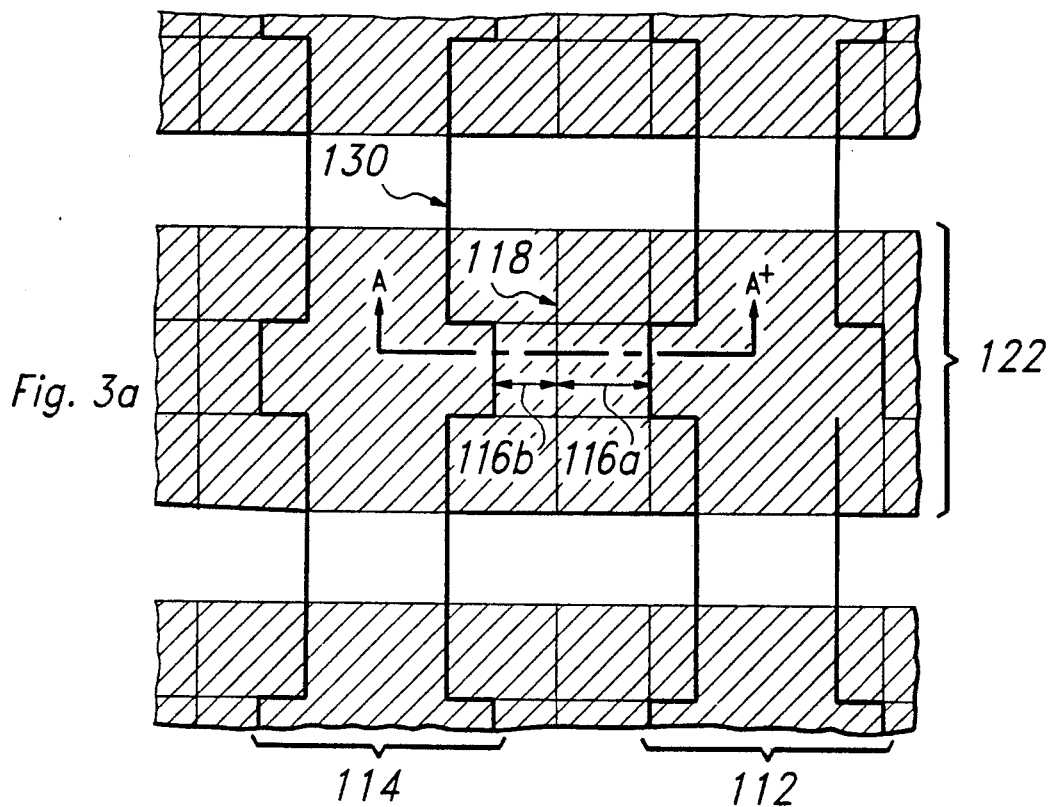
FIG. 3a is a virtual ground array implementation of the cell in contactless array configuration.
Figure 3B:
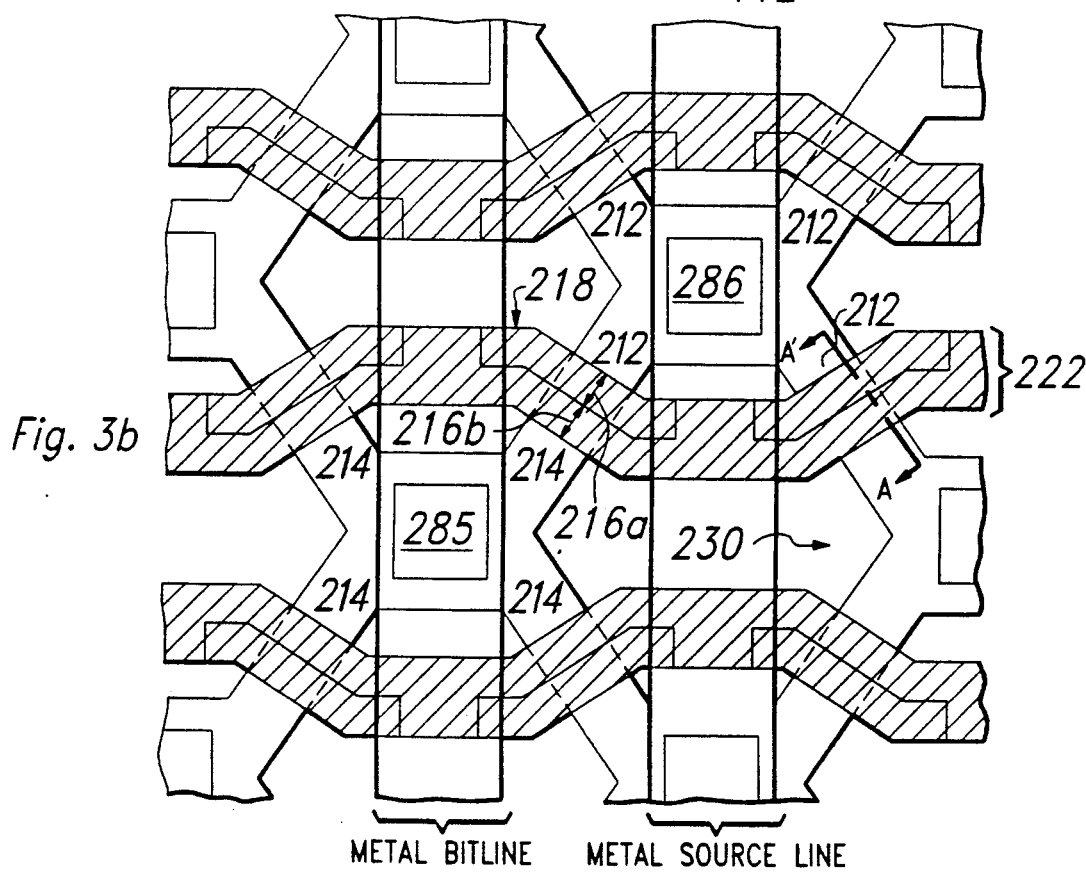
FIG. 3b is a virtual ground array implementation of the cell in x-cell array configuration.

As shown in the layouts of FIGS. 3a and 3b, the implementation of this cell in virtual ground array can be accomplished by either of the two array configurations.

First, a contactless array, illustrated in FIG. 3a, where bitlines 114 (e.g., n+ drain diffusion) and source line 112 (e.g., n+ diffusion) are buried under the thick oxide (34 and 36 of FIG. 1). An example of a contactless array is described in U.S. Pat. No. 5,025,494 (TI-12513) or co-pending Ser. No. 403,065 (TI-12514A). The contactless array reduces the array contact density and therefore improves array manufacturability. These diffusions 112 and 114 form source lines and bitlines referred to in FIG. 2 as SLO; BLO,1; SL1,2; BL1,3 and SL3. The metal source lines and metal bitlines have not been shown for simplicity.

A conductive floating gate 118 is formed adjacent the above mentioned source diffusion 112. The floating gate 118 may be separated from the silicon substrate by silicon dioxide. This floating gate 118 covers a channel area 116a. Formed over the floating gate and rest of the channel 116b is the control gate 122, for example made of polysilicon and insulated from the floating gate by the interlevel insulator oxide/nitride/oxide sandwich 24 as shown in FIG. 1. The remaining portion of the channel is insulated from control gate 122 by oxide 26 shown in FIG. 1. This control gate 122 forms one of the wordlines WL1, WL2, WL3 and WL4 etc. as shown in FIG. 2.

The bitlines 114, 112 and adjacent word lines are isolated from each other by field oxide 130. The floating gate 118 and control gate 122 overlap onto the field oxide 130 for enhanced capacitive coupling between control gate 122 and floating gate 118.

Referring now to FIG. 3b, an x-cell array is shown. Here, source 212 and drain 214 regions (corresponding to 12 and 14 in FIG. 1) are contacted by metal lines, at contacts 285 and 286 so as to form the bitlines and source lines shown in FIG. 2. A common drain contact 214 is shared by four adjacent bits, and a common source contact 212 is shared by four adjacent bits. The source region 212 corresponding to each bit is contacted by metal. Likewise, the drain region 214 corresponding to each bit is contacted by metal.

A conductive floating gate 218 is formed adjacent the above mentioned source diffusion 212. The floating gate 218 may be separated from the silicon substrate by silicon dioxide. This floating gate 218 covers a channel area 216a. Formed over the floating gate and rest of the channel 216b is the control gate 222, for example made of polysilicon and insulated from the floating gate by the interlevel insulator oxide/nitride/oxide sandwich 24 shown in FIG. 1. The remaining portion of the channel is insulated from the control gate 222 by oxide 26 shown in FIG. 1. This control gate 222 forms one of the wordlines WL1, WL2, WL3 and WL4 shown in FIG. 2.

The floating gate 218 and control gate 222 may overlap onto the field oxide 230 for enhanced capacitive coupling between control gate and floating gate.

The x-cell implementation reduces the array source bias during programming because the source current is carried by metal lines. In case of contactless array, the source bias during programming is a little higher because of the higher IR drop through the n+ diffusion.

Figure 4:
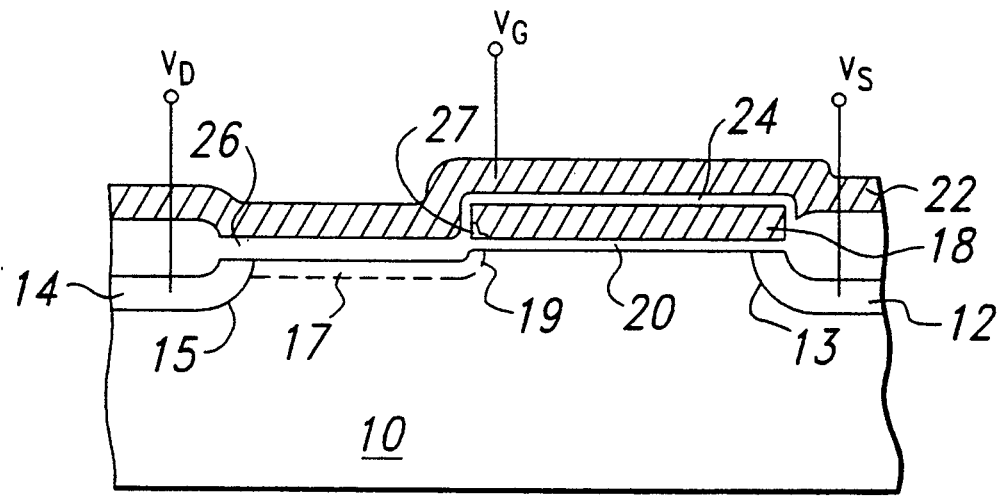
FIG. 4 is a cross sectional view of a cell being programmed.

Referring now to FIG. 4, in one exemplary method, the cell is programmed by grounding the source 12 (i.e., $V_S=0$ volts), setting the gate voltage $V_G$ to about 12 volts and applying a voltage $V_D$ of about 5 to 10 volts to the drain node 14. The application of the voltage $V_G$ will create an inversion region 17 under the pass gate oxide 26. The inversion region 17 extends from the drain junction to the floating gate 18. The inversion layer 17 is relatively abrupt and shallow and can be used as drain for programming of the FAMOS structure. A pseudo junction 19 is formed between the inversion region 17 and the first portion of the channel region 16a beneath the floating gate 18. In other words, this device is programmed in the middle of the cell near point 27—a distinction and an advantage over prior art structures which program at the source/channel junction 13. Since the cell 8 is programmed away from the source junction 13, the source junction 13 may be optimized for erasure.

The dielectric region 25 which is formed on the sidewall of the floating gate 18 is typically between 100 Å and 400 Å. The thickness must be great enough to avoid leakage between the floating gate 18 and the control gate 22 but also must be small enough so that the inversion layer 17 is close enough to the floating gate 18 for hot electron injection to occur.

The drain junction 15 may also be graded since the drain/channel junction 15 does not play a very significant role in the programming itself. The programming really occurs much further away in the middle of the cell near point 27 at pseudo junction 19.

The cell structure and method of reading offer great immunity from read disturb. With a graded drain, one can read the cell from the drain side (e.g., $V_S=0$ V, $V_G=5$ V, and $V_D=1.5$ V). Since the read voltage is on the drain junction adjacent the pass gate channel, with the pass gate oxide 26 thicker than the FAMOS channel oxide 20, read disturb from channel hot electron injection to the floating gate 18 and to the pass gate 24 is minimized. Whether the drain junction 15 is graded or not will depend upon design choice and does not matter for the purposes of this invention. Alternatively, the cell can be read from the source junction 13 side to provide read disturb free characteristics since the source junction 13 is graded.

The cell may be erased in a number of ways. In one method, the source voltage $V_S$ is set to about 12 volts, the gate is grounded (i.e., $V_G=0$ volts), and the drain voltage $V_D$ is allowed to float. In another method, the source voltage $V_S$ is set to about 5 volts, the gate voltage $V_G$ is set to about −9 to −12 volts, and the drain voltage $V_D$ is allowed to float. The cells may be bulk erased (i.e., the whole chip erased at once), block erased (i.e., many cells erased at once), or each cell may be erased singly, as is known in the art. Table 1 summarizes the operation of the array shown in FIG. 2 with exemplary voltage values given parenthetically.

TABLE 1

| NODE | PROGRAM | FLASH ERASE Option 1 | FLASH ERASE Option 2 | READ Option 1 | READ Option 2 |
|---|---|---|---|---|---|
| SL$\theta$ | Float | $V_{PP}$ (12 V) | $V_{CC}$ (5 V) | No Connection | No Connection |
| BL$\theta$,1 | $V_D$ (3.5–10 V) | Float | Float | $V_{SS}$ (0 V) | $V_{READ}$ |
| SL1,2 | $V_{SS}$ (0 V) | $V_{PP}$ (12 V) | $V_{CC}$ (5 V) | $V_{READ}$ (1–1.5 V) | $V_{SS}$ (0 V) |
| BL2,3 | Float | Float | Float | No Connection | No Connection |
| SL3 | Float | $V_{PP}$ (12 V) | $V_{CC}$ (5 V) | No Connection | No Connection |
| WL1 | $V_{SS}$ (0 V) | $V_{SS}$ (0 V) | $V_{EE}$ (−9 to −15 V) | $V_{SS}$ (0 V) | $V_{SS}$ (0 V) |
| WL2 | $V_G$ (9–15 V) | $V_{SS}$ (0 V) | $V_{EE}$ (−9 to −15 V) | $V_{SENSE}$ (5 V) | $V_{SENSE}$ (5 V) |
| WL3 | $V_{SS}$ (0 V) | $V_{SS}$ (0 V) | $V_{EE}$ (−9 to −15 V) | $V_{SS}$ (0 V) | $V_{SS}$ (0 V) |
| WL4 | $V_{SS}$ (0 V) | $V_{SS}$ (0 V) | $V_{EE}$ (−9 to −15 V) | $V_{SS}$ (0 V) | $V_{SS}$ (0 V) |

The preceding examples are typical of possible configuration for the non-volatile memory cells; however, as is well known in the art, the voltages, structure sizes and doping concentrations can be varied and similar results achieved.

Figure 5A:
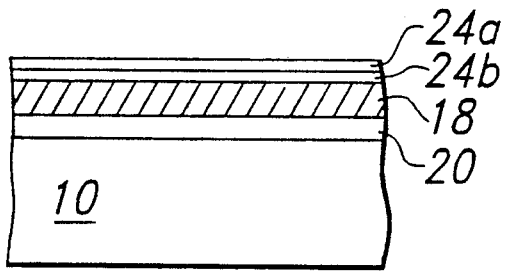

A process for fabricating a preferred embodiment of the present invention is illustrated in FIGs. 5a–5e. The process for forming periphery transistors (e.g., logic and control circuitry) will not be discussed for the sake of simplicity. Referring to FIG. 5a, after the LOCOS (local oxidation of silicon) process for defining the field region (e.g., 130 in FIG. 3a), insulating layer 20 is formed on the surface of substrate 10. One method of forming an insulation layer, for example, is to thermally grow an oxide. The surface of substrate 10 may be doped to a given doping concentration prior to forming the insulation layer 20.

Next, conductive layer 18 is formed over insulating layer 20. Conductive layer 18 will become the floating gate. For example, forming conductive layer 18 may comprise depositing and doping, or in situ doping, polysilicon. Next an insulating layer 24 is formed over conductive layer 18. Layer 24 may comprise multiple layers. As shown in FIG. 5a, for example, layer 24 may comprise an oxide layer 24b formed beneath a nitride layer 24a. The nitride layer 24a is used in this case to control the thickness of layer 24 since later oxidations will be blocked in this region by the nitride.

Figure 5B:
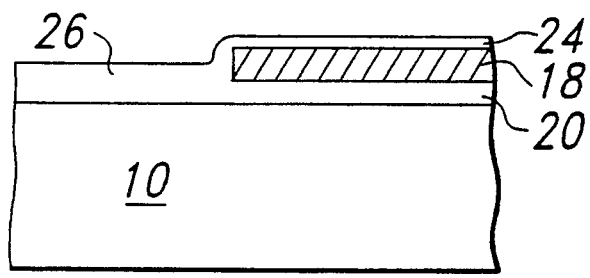
Figure 5C:
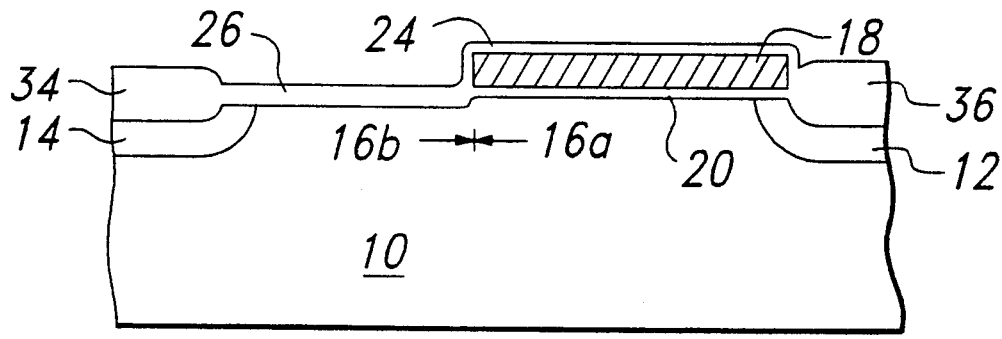
Figure 5D:
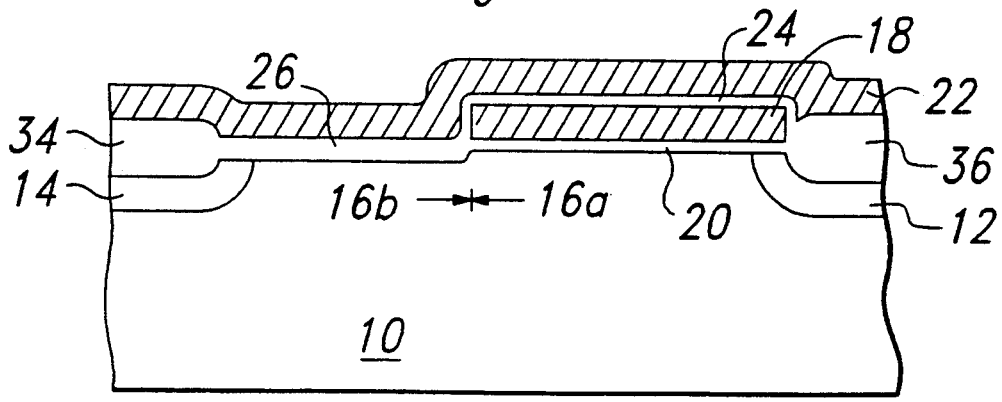

Referring now to FIG. 5b, a portion of the surface is exposed by etching the previously deposited materials 18, 20, and 24 using standard lithographic and etching processes. Next, using source/drain mask, a photoresist is defined so that right hand side of layer 18 (source 12) and the drain region 14 are exposed, and implanted with arsenic (approximate does of $5\times10^{15}$ cm$^2$, 60 to 135 kev.) and phosphorus (dose of $1\times10^{13}$ to $1\times10^{15}$ cm$^2$, 60–100 kev). After resist removal and cleanup, another insulating layer 26, such as silicon dioxide, is formed over the exposed surface. The layer 26 will serve as the pass gate oxide and as such may be thicker than the layer 20 which will serve as the FAMOS gate oxide. During the oxidation process which results in layer 26, a thicker oxide 36 and 34 will grow on source/drain 12/14 regions because of high doping levels of arsenic on source/drain 12/14 regions. In addition, exposed edges of the floating gate 18 will also be oxidized. These steps are illustrated in FIG. 5c. The next process step entails forming a conductive layer 22 for the control gate over insulating layers 24 and 26 using standard procedures.

It should be noted that if the doping concentration of the channel region beneath the pass gate oxide is to be different than the doping concentration of the channel region beneath the FAMOS gate oxide, an additional doping step is performed either before or after forming layer 26.

The techniques which may be used for deposition, doping and etching are well known in the current art and are strictly by design choice.

A deep graded source junction has been formed in the source region 12. One method to form a deep graded junction is to dope the region 12 with both arsenic and phosphorus and dope the region 14 with arsenic only or arsenic with a low dose of phosphorus followed by a relatively high temperature anneal. The phosphorus will diffuse into the substrate and beneath the floating gate to a greater extend than the arsenic, thereby creating the desired junction. As previously discussed, the drain region 14 may also be graded in which case it would be treated as region 12. The doping profiles may also be different in regions 12 and 14.

An alternative method of source/drain fabrication follows. After formation of floating gate layer 18, source/drain regions are implanted using photoresist as a mask, with the source region implant self aligned to the floating gate 18 edge. After photoresist removal, and a clean up, source/drain implants are annealed at relatively high temperature, followed by oxidation which grows oxide over the floating gate, on source/drain regions, over pass gate channel region, and on exposed edges of the floating gate. The oxide grown on source/drain regions is thicker than that grown on other regions because of heavy arsenic doping of source/drain regions. This is followed by nitride layer formation and oxidation of nitride layer, resulting in ONO layer on top of the floating gate, channel region and on source/drain regions. After this, formation of the control gate layer is performed.

To complete the fabrication process, after formation of the control gate layer 22, an oxide layer (not shown) may be grown around control gate layer 22, floating gate 18 and any exposed regions of substrate. This oxide layer (not shown) is used for enhanced data retention. Next, a BPSG (borophosilicate glass) layer (not shown) may be deposited and reflowed. The contacts, metal and protective overcoat processes (not shown) may be performed next, as is well known in the art.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A non volatile memory cell structure, comprising:
   a semiconductor substrate comprising a first highly doped source region and a second highly doped drain region separated by a channel region;
   a conductive floating gate formed over a first portion of a channel region adjacent to said first doped region, wherein said floating gate is separated from said first portion of said channel region by a first insulation layer;
   a conductive control gate formed substantially over but electrically insulated from said floating gate and formed over a second portion of said channel region which is not beneath said floating gate, wherein said control gate is separated from said second portion of the channel region by a second insulation layer, said first doped region being self-aligned to said floating gate, and said first and second doped regions buried under and insulated from said control gate by a thick insulator; and
   circuitry for creating an inversion region in said second portion of said channel region wherein said inversion region is an extended drain region formed at the surface of the second channel region between the second highly doped drain region and the first channel region beneath the floating gate wherein a pseudo junction is formed between said inversion region and said first portion of said channel region and wherein electrons can be injected into said floating gate from said inversion region for programming of the memory cell such that electrons can be injected into the floating gate from a point near an end of the floating gate which is away from the highly doped source region; erasure of said cell is provided via the highly doped source region.

2. The structure of the claim 1 wherein the thickness of said first insulation layer is less than the thickness of said second insulation layer.

3. The structure of claim 1 wherein the doping concentration in said first portion of the channel region is lighter than the doping concentration in said second portion of the channel region.

4. The structure of claim 1, where the junction between said first highly doped region and said channel region and the junction between said second highly doped region and said channel region are both graded junctions.

5. The structure of claim 1, where the junction between said first highly doped region and said channel region is graded to optimize an erase function of the cell and the junction between said second highly doped region and said channel region is abrupt to optimize the programming of the cell.

6. The structure of claim 1, wherein said floating gate and said control gate comprise polysilicon and said insulation layers comprise silicon dioxide.

7. The cell of claim 1 wherein said first and second highly doped source and drain regions comprise heavily doped n-type silicon and said channel region comprises lightly doped p-type silicon.

8. The cell of claim 1 wherein said floating gate and said control gate comprise polysilicon.

9. The cell of claim 1 wherein said control gate is insulated from said floating gate by a layer of non-conductive material between about 200 and 300 angstroms thick.

10. The cell of claim 9 wherein said non conductive material is at least partially silicon dioxide.

11. The cell of claim 9 wherein said non-conductive material is an oxide/nitride/oxide layer.

12. The cell of claim 1 wherein said cell is one cell in an array of like cells.

13. The cell of claim 12 wherein said array comprises an x-cell array, and can be integrated into a virtual ground array architecture.

14. The cell of claim 12 wherein said array comprises a contactless cell array, and can be integrated into a virtual ground array architecture.

* * * * *